United States Patent [19]
Stevanovic et al.

[11] Patent Number: 5,952,832
[45] Date of Patent: *Sep. 14, 1999

[54] DIAGNOSTIC CIRCUIT AND METHOD FOR PREDICTING FLUORESCENT LAMP FAILURE BY MONITORING FILAMENT CURRENTS

[75] Inventors: Ljubisa Dragoljub Stevanovic, Clifton Park; Robert Louis Steigerwald, Burnt Hills, both of N.Y.; Wing Yeung Chung, Erie, Pa.

[73] Assignee: General Electric Company, Schenectady, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/761,269
[22] Filed: Dec. 6, 1996
[51] Int. Cl.$^6$ ................................................... G01R 31/00
[52] U.S. Cl. ........................... 324/414; 324/403; 315/107
[58] Field of Search ........................... 324/403; 315/102, 315/225, 209, 101, 106, 276, 307, 107, 105, 309

[56] References Cited

U.S. PATENT DOCUMENTS

| | | | |
|---|---|---|---|
| 4,396,866 | 8/1983 | Bay | 315/106 |
| 4,853,598 | 8/1989 | Kusko | 315/101 |
| 5,315,214 | 5/1994 | Lesea | 315/209 |
| 5,466,992 | 11/1995 | Nemirow | 315/276 |
| 5,578,998 | 11/1996 | Kasprowicz | 340/642 |
| 5,623,184 | 4/1997 | Rector | 315/102 |
| 5,650,694 | 7/1997 | Jayaraman | 315/225 |
| 5,703,441 | 12/1997 | Steigerwald et al. | 315/307 |

OTHER PUBLICATIONS

S.N. 08/551,968, filed Nov. 2, 1995 (RD–24,583).

*Primary Examiner*—Josie Ballato
*Assistant Examiner*—Thomas Valone
*Attorney, Agent, or Firm*—Jill M. Breedlove; Douglas E. Stoner

[57] ABSTRACT

A diagnostic circuit monitors filament currents in hot cathode fluorescent lamps for detecting when the filament erodes to the point of breaking. When such a filament failure is detected, information is processed and a request is sent to replace the lamp before it actually fails. The diagnostic circuit is low power and low voltage and is electrically isolated from the high-voltage end of the lamp. Additionally, a simple circuit to regulate rms value of filament voltage without having to compute or otherwise measure the actual rms value is provided.

20 Claims, 4 Drawing Sheets

DIAGNOSTIC CIRCUIT AND METHOD FOR PREDICTING FLUORESCENT LAMP FAILURE BY MONITORING FILAMENT CURRENTS

FIELD OF THE INVENTION

The present invention relates generally to fluorescent lamps and, more particularly, to a diagnostic circuit and method for predicting failure of fluorescent lamps by monitoring filament currents.

BACKGROUND OF THE INVENTION

The life of hot cathode fluorescent lamps is primarily limited by wearing of filaments. Most often, lamp failure is preceded and caused by filament failure wherein an erosion of filament material results in filament failure and, consequently, lamp failure. Moreover, hot cathode fluorescent lamps usually fail in an abrupt fashion. Namely, as the lamp ages and its filament wears, there are usually no obvious early signs of approaching failure.

In typical fluorescent lamps, filaments are electrodes positioned at opposite ends of the lamp tube. The negative electrode, or cathode, emits electrons into the gas discharge while the positive electrode, or anode, collects the electrons at the other end of the discharge. In typical applications, the lamp operates in an AC mode such that the filaments alternate between functioning as cathode and anode during each power cycle. Filaments are typically made of coiled tungsten wire coated with emission mix material which has a low work function, i.e., emits electrons easily when heated to a high temperature. For proper lamp operation and to maximize lamp life, it is necessary to limit erosion of filament material by maintaining filament temperature in a relatively narrow range. If the filament is allowed to operate below or above this temperature range, its life will be adversely affected. For example, if the filament temperature is lower than optimum, the number of thermionic electrons is insufficient to maintain desired discharge current, causing the voltage between the cathode and the discharge, i.e. the cathode fall voltage, to increase. As a result, ions collected by the cathode get accelerated as they reach the cathode, impacting the electrode surface at a higher speed and causing additional electrons to be emitted. The process is called ion bombardment and leads to sputtering of filament material and shorter lamp life. Conversely, if the filament temperature is allowed to increase too much, evaporation of emission material from electrodes will take place, accelerating filament wear and shortening lamp life.

There exist several methods for maintaining filament temperature in the optimum range. For lamps operated at constant current, lamp filaments may be specifically designed for that current, so that heat generated by the discharge current maintains the filament temperature close to optimal. Another approach is to add a shunt capacitance in parallel with the lamp at the output of a high frequency electronic ballast. By connecting a shunt capacitance in series with two filaments, part of the ballast output current is diverted through the filaments, generating heat. Capacitor size is optimized for required filament heating. In dimming applications wherein lamp current varies over a wide range depending on selected light output, a separate filament heater power supply may be used to adjust filament heating depending on the lamp current, such as described in commonly assigned U.S. Pat. No. 5,703,441 of R. L. Steigerwald, Chester F. Saj, and Ljubisa D. Stevanovic, issued Dec. 30, 1997.

Unfortunately, even if filament temperature is optimal, erosion of filament material continually takes place through processes of evaporation and sputtering, eventually causing filaments to break. After a filament breaks, the lamp usually continues to run for a relatively short period of time before it fails, e.g., several hours to several weeks. The length of this "residual life" depends on a number of factors, such as output voltage capability of the ballast, whether there is a dimming function, inter alia. Filament breakage also disconnects circuitry provided for additional heating, such as the hereinabove described shunt capacitor or filament heater supply, causing filament temperature to drop and thus further accelerating the process of filament erosion through ion bombardment until the emission mix sputters away completely. At that point, tungsten and copper in the filament wire and contacts are the only sources of electrons. Both of these materials have a relatively high work function and thus will start to heat up and increase the temperature of the lamp base, causing the glass tube to crack and, in turn, causing leakage of the gas fill, resulting in lamp failure.

Hence, by maintaining filament temperature close to optimal, lamp life can be extended significantly. Nowadays, commercially available hot cathode fluorescent lamps have rated life up to twenty thousand hours. This is more than adequate for most applications, such as household and office lighting. However, in high reliability, high performance systems, such as backlighting for aircraft LCD, lamp failure is the predominant failure mode and is a definite limitation. The problem is further exacerbated by the unpredictability of the failure mechanism of the lamp, as described hereinabove.

Accordingly, it is desirable to provide a simple and reliable diagnostic circuit and method for detecting filament failure, i.e., breakage, and thus indicating that the lamp needs to be replaced before it actually fails. Further, since the voltage difference between two filaments of one lamp can be as high as several hundred volts during starting, the diagnostic circuit should be isolated from at least one filament. Still further, it is desirable that such diagnostic circuit not interfere with normal operation of the lamp, ballast, and filament heater power supply.

SUMMARY OF THE INVENTION

A diagnostic circuit monitors filament currents in hot cathode fluorescent lamps for detecting filament breakage before lamp failure. In systems wherein filament heating is achieved by diverting part of the ballast output current, such as through a shunt capacitor connected in series with the filaments, the diagnostic circuit monitors current diverted through the filaments and shunt capacitor. In systems with an external filament heater power supply, the diagnostic circuit monitors filament currents on either the primary or secondary side of the filament heater supply. Sensing of the filament current can be performed by either current transformers, sensing resistors, or other appropriate current sensing devices, such as Hall-effect sensors. The diagnostic circuit is low power and low voltage and is electrically isolated from the high-voltage end of the lamp. Isolation can be achieved by using isolated current sensors, such as current transformers or Hall-sensors, or even simpler by placing sensing resistors on the primary side of the filament heater supply. Additionally, the present invention provides a simple way to regulate rms value of filament voltage without having to compute or otherwise measure the actual rms value.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
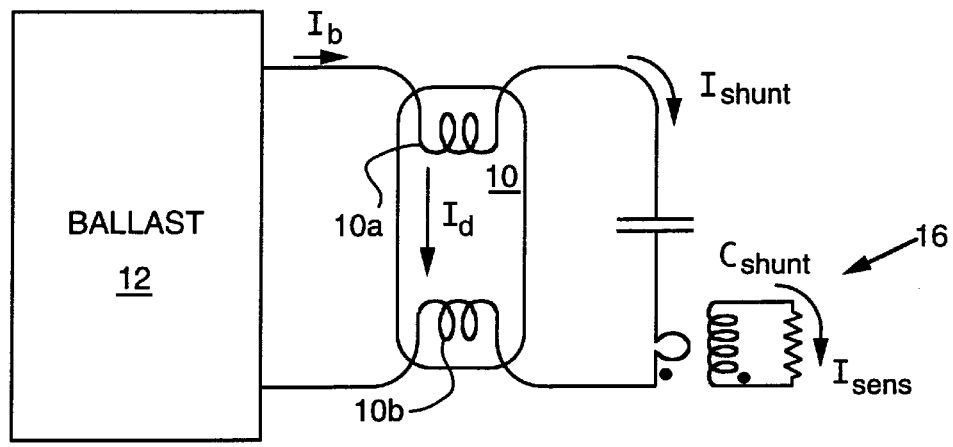
FIG. 1 illustrates a fluorescent lamp system including a diagnostic circuit in accordance with the present invention.

FIG. 1 illustrates a fluorescent lamp system including a fluorescent lamp 10 with two filaments 10a and 10b and a ballast 12 for driving the lamp. The filaments are connected in series with a shunt capacitance $C_{shunt}$ and a current sensor 16. Any suitable current sensor may be used such as a sensing transformer (as illustrated in FIG. 1), a sensing resistor, or other appropriate current sensing device, such as a Hall-effect sensor. The ballast current is designated as $I_b$ and the discharge current between the filaments in the lamp is designated as $I_d$. In this configuration, some of the ballast output current is diverted through the shunt capacitance, and hence the series-connected current sensor. If the shunted current is lower than a predetermined threshold, then one or both of the filaments has eroded, possibly to the breaking point. Advantageously, with filament failure thus detected, the lamp can be replaced before it fails.

Figure 2:
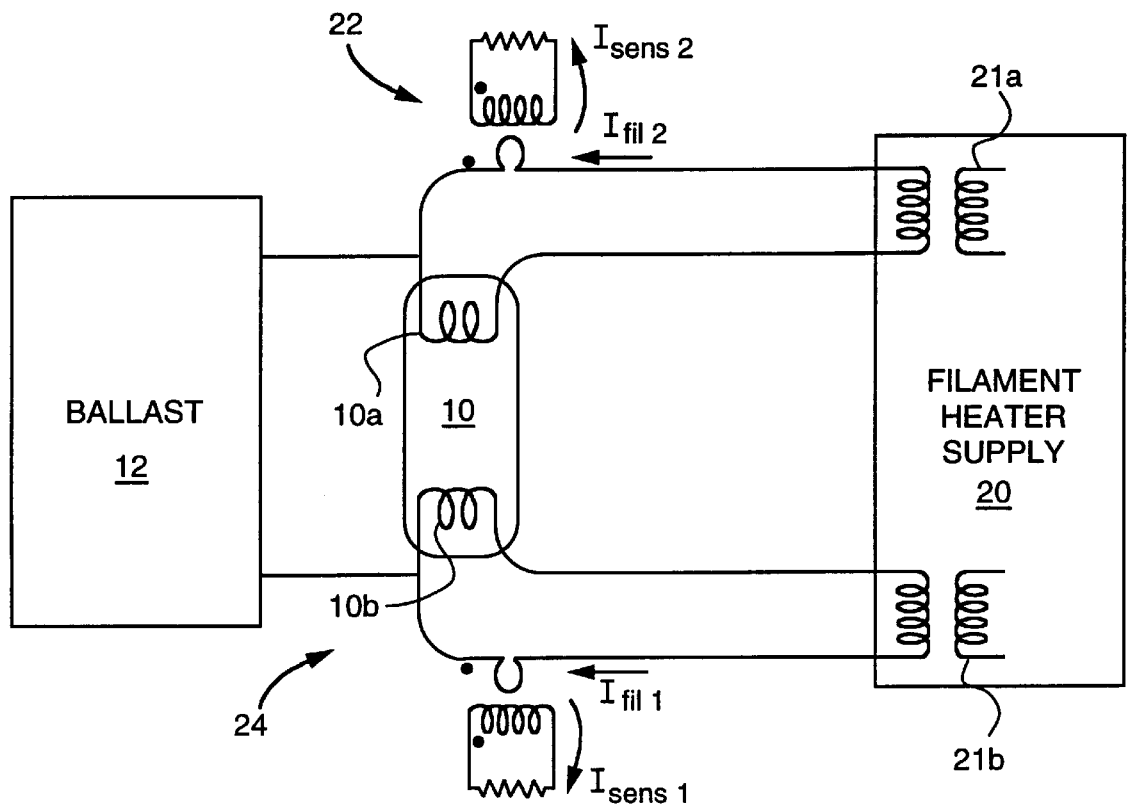
FIG. 2 illustrates a fluorescent lamp system including a separate filament heater power supply and a diagnostic circuit in accordance with the present invention.

FIG. 2 illustrates a fluorescent lamp system including a separate filament heater power supply 20. As shown, each filament 10a and 10b is supplied via transformer coupling by supply 20. Specifically, filament 10a is supplied via a winding 21a and filament 10b is supplied via a winding 21b. A current sensor, illustrated as a current sensing transformer, 22 and 24, respectively, is connected in series with each filament 10a and 10b, respectively. If the value of either sensed filament current $I_{sens1}$ or $I_{sens2}$ is lower than a predetermined threshold, then a filament failure is indicated such that the lamp can be replaced before it fails.

Figure 3:
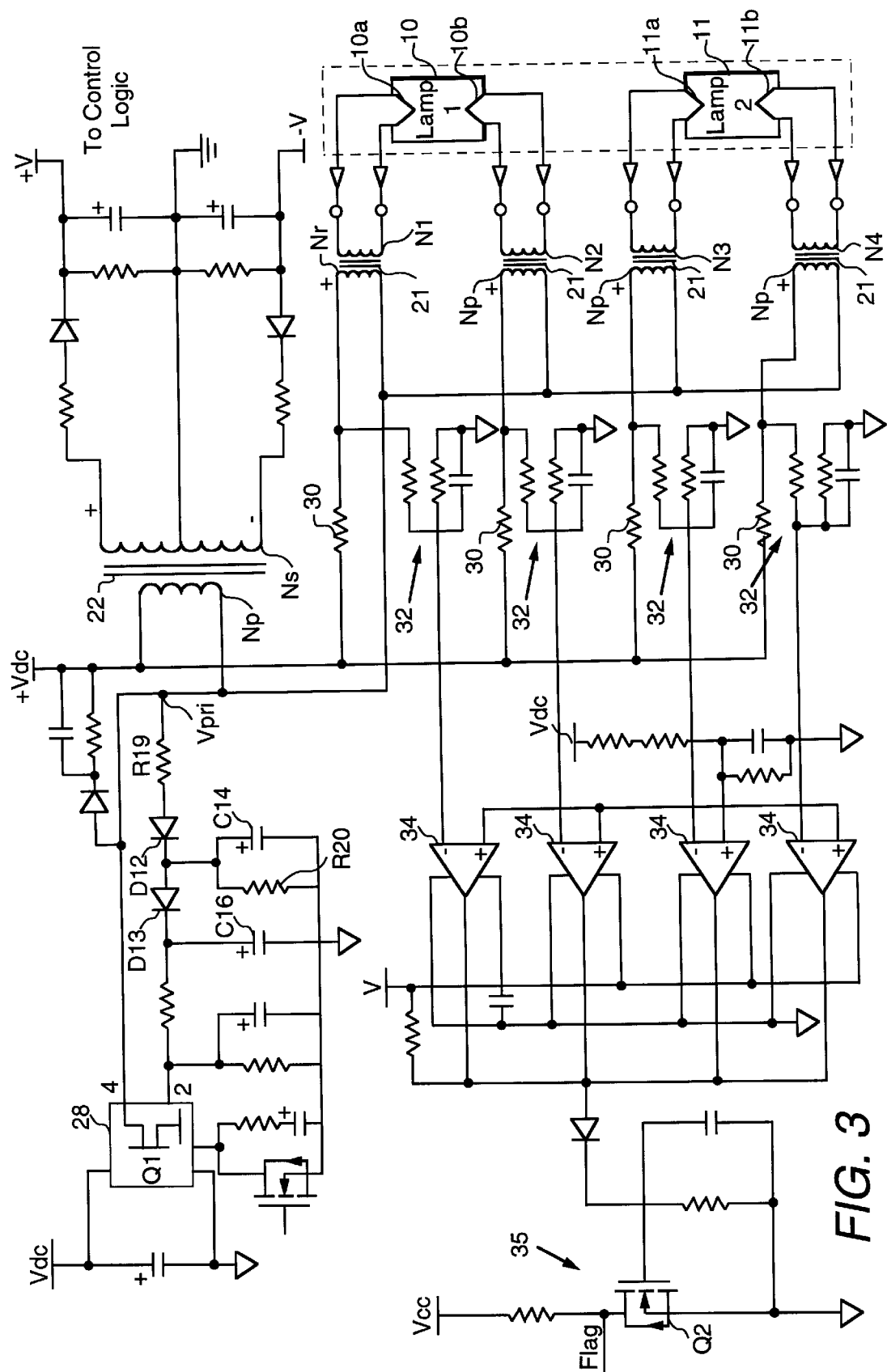
FIG. 3 schematically represents a two-lamp system showing a separate filament heater supply and a diagnostic circuit in accordance with the present invention.

FIG. 3 schematically illustrates a fluorescent lamp system comprising two lamps 10 and 11 and a separate filament heater supply 20 and diagnostic circuitry in accordance with the present invention. Filament heater supply 20 is a combination forward and flyback converter of a type described in U.S. Pat. No. 05/703,441, cited hereinabove. However, as an advantage over U.S. Pat. No. 05/703,441, the output of each filament supply is an ac waveform, rather than dc as described in that application, eliminating the rectification and filtering circuit that would otherwise be needed. However, with this ac output, it is not straightforward how the rms voltage (heating) of the filament can be sensed and regulated. A new method of achieving this regulation will be described hereinafter.

The filament heater supply converts an input dc voltage (e.g., 12volts) to provide isolated voltages through a separate transformer 21 for each filament, each transformer having a primary winding Np and secondary windings N1, N2, N3, and N4, to the four lamp filaments 10a, 10b, 11a, and 11b, respectively. (In an alternative embodiment, a single transformer may be used having a separate secondary winding coupled to each respective filament.) The filament heater power supply has an additional transformer 22 for providing power, after rectification, to a control logic circuit (not shown) which controls both the ballast inverter (not shown) and the filament heater power supply, as described in U.S. Pat. No. 5,703,441.

Filament heater supply 20 comprises a PWM regulator 28, with an internal main switching device Q1. The PWM regulator has an internal comparator that compares the feedback signal at pin 2 with an internal reference and adjusts the duty ratio of gating pulses to the internal power device Q1 to maintain the feedback signal equal to the reference. Since the feedback signal is approximately proportional to the rms value of the filament voltage, as described hereinafter, regulation of rms filament voltages is accomplished. The four windings N1–N4 act in a flyback mode; that is, energy is stored in the core of each transformer 21 when Q1 is on and is transferred to the output when Q1 is turned off. The lamp filament voltage level is controlled by the duty cycle of Q1.

A current sensor 30 is connected in series with each transformer primary. In the embodiment of FIG. 3, current sensors 30 each comprise a current sensing resistor situated on the primary side of transformer 21. The current sensing resistors are each connected through voltage dividing circuitry 32 to provide an input to a comparator 34. The other input to the comparators is a reference voltage $V_{ref}$. If the peak value of one or more of the sensed filament currents is less than a predetermined threshold as set by the voltage reference, then the output of the comparator is low, turning off a switching device Q2 in lamp failure detection circuitry 35, and thus providing a high value signal FLAG to indicate that a lamp should be replaced.

Detection of filament current on the primary side as illustrated in FIG. 3 is advantageous because a primary side ground reference is utilized, and the required sensing and detection circuitry is quite simple.

In the diagnostic circuitry of the present invention, each transformer 21 advantageously has dual uses: (1) to provide heating for the filaments and (2) to isolate the diagnostic circuitry from the high voltage side of the lamp system.

Figure 4:
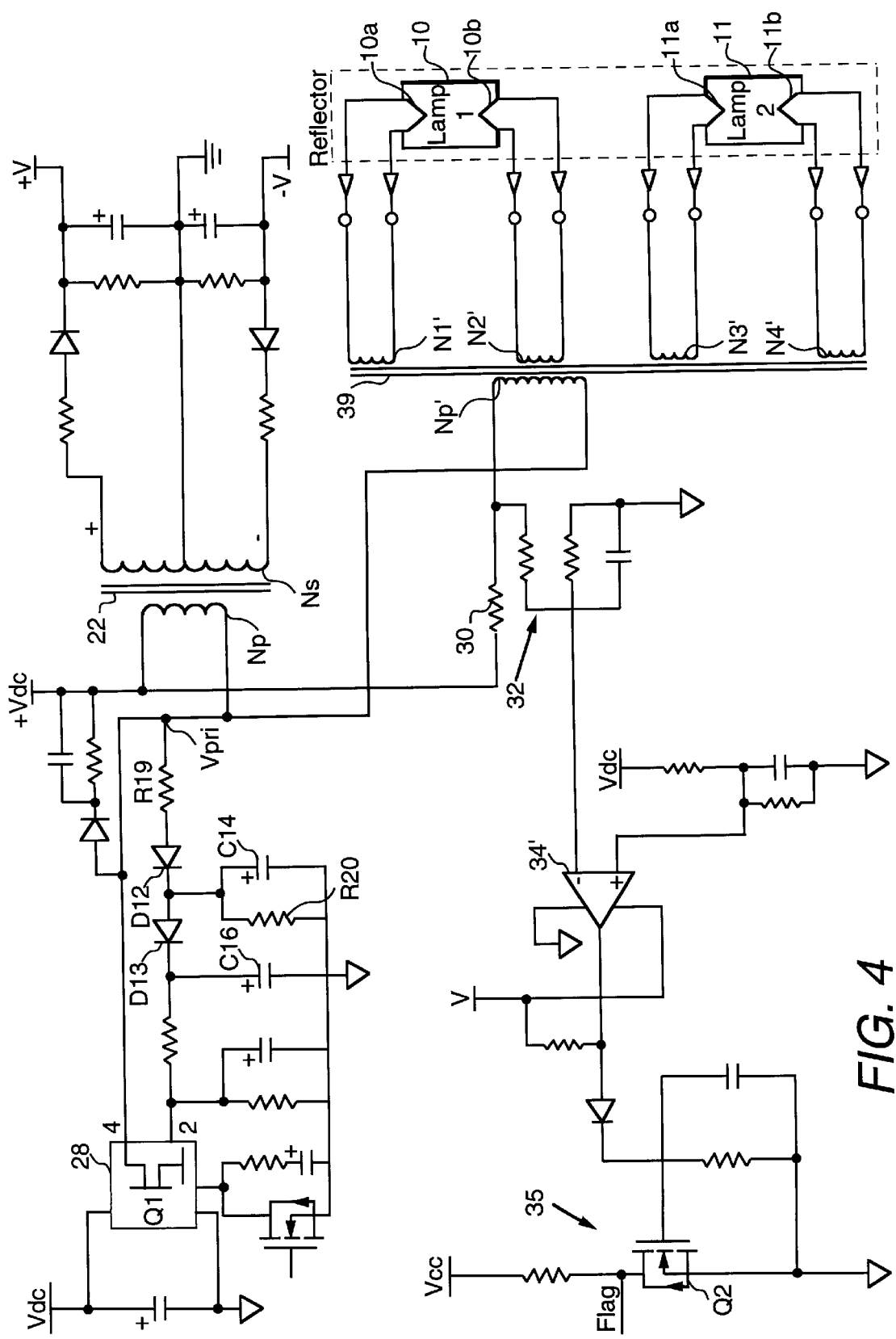
FIG. 4 schematically represents a two-lamp system showing a separate filament heater supply and a diagnostic circuit in accordance with an alternative embodiment of the present invention.

In an alternative embodiment, as illustrated in FIG. 4, a single sensing device 30' may be employed to sense the instantaneous sum of currents through each filament. In the embodiment of FIG. 4, a single primary winding Np' is coupled to four separate secondary windings N1', N2', N3', and N4' on a single core 39. The peak value of the instantaneous sum of currents through each threshold is compared to a predetermined threshold in a comparator 34'. If the instantaneous sum of currents through each filament is less than the threshold, then filament failure is indicated.

In addition to the advantages of the lamp diagnostic circuitry described hereinabove, the present invention provides a simple way to regulate the rms filament voltage waveform on the primary side of transformers 21 without having to compute/measure the actual rms value. In particular, the circuit provides a way to control the peak filament voltage during the off-time of device Q1. To this end, an approximately one-half duty cycle, e.g., Q1 on for approximately 50% of the power cycle, is selected. The approximately 50% duty cycle is regulated by feedback derived from the transformer primaries. With Q1 on, some energy is transferred directly to the filaments and some energy is stored in the magnetizing inductance of the transformers. With Q1 off, the energy stored in the magnetizing inductance is discharged in the filament. During the off-time of Q1, the transformer primary voltage Vpri is equal to the lamp filament voltage scaled by the transformer turns ratio. The feedback circuit comprising diode D13 and capacitor C16 is designed to detect the peak value of the voltage Vpri during the off-time of Q1. A spike filter comprising resistor R19, diode D12, resistor R20, and capacitor C14 is designed to eliminate switching spikes due to transformer leakage inductance. It can be shown that the rms value of the filament voltage is approximately proportional to the peak value of filament voltage during the off-time of Q1, assuming magnetizing inductance is large. In most practical cases, this condition is satisfied and good accuracy of the sensing method is achieved.

Figure 5:
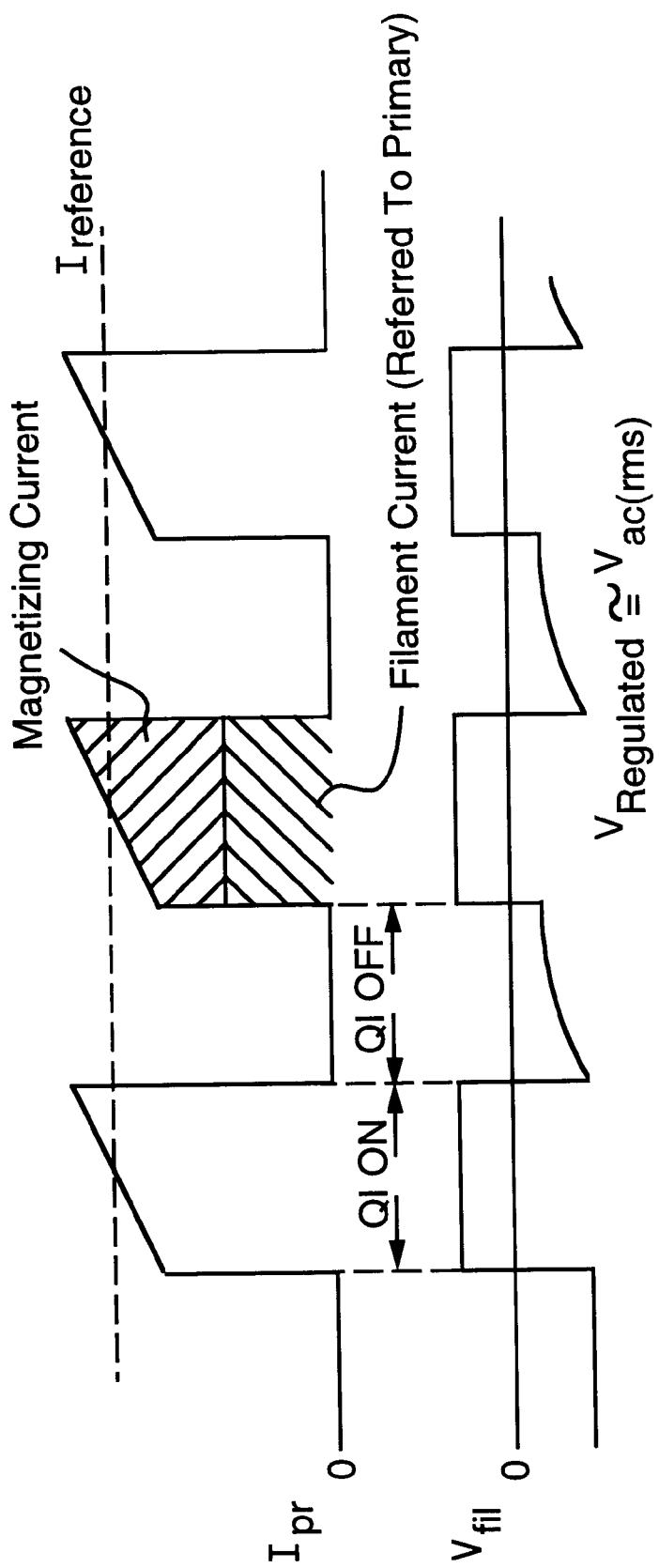
FIG. 5 graphically illustrates primary current and filament voltage, such graphical illustrations being useful for understanding a diagnostic circuit in accordance with the present invention.

FIG. 5 graphically illustrates the primary current waveform comprising the filament current, referred to the primary, and the magnetizing current. As described hereinabove, if the peak of the primary current falls below the predetermined threshold $I_{reference}$, then a filament breakage is indicated.

FIG. 5 also illustrates the regulated filament voltage waveform $V_{fil}$ corresponding to the primary current waveform. As described hereinabove, during the off-times of Q1, the energy stored in the magnetizing inductance discharges in the filament resistance. The negative portion of the filament voltage is reflected through the transformer back to the primary where its peak value is sensed and compared to an internal reference of the PWM regulator 28 and used to adjust the duty ratio of the switch Q1, thus regulating the rms filament voltage.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A circuit for predicting lamp failure by monitoring filament currents in a fluorescent lamp system, the lamp having at least two filaments, comprising:

at least one current sensor for sensing current through the filaments; and a detection circuit for comparing the current through the filaments to a predetermined threshold and for providing a signal indicative of filament failure in anticipation of filament failure if the value of current through the filaments is less than the threshold, the detection circuit comprising a dual-use transformer for coupling power to the lamp system and for providing voltage isolation for the detection circuit, operation of the lamp being maintained during indication of filament failure by the detection circuit.

2. The circuit of claim 1 wherein the at least one current sensor is selected from a group consisting of current transformers, Hall-effect sensors, or current sensing resistors.

3. The circuit of claim 1 wherein at least one current sensor comprises a primary-side sensing resistor.

4. The circuit of claim 1 coupled to a filament heater supply such that each filament is coupled to the filament heater supply through a separate secondary winding.

5. The circuit of claim 4 wherein the filament heater supply comprises a switching converter.

6. The circuit of claim 5, further comprising means for regulating rms filament voltage by adjusting duty cycle of the switching converter.

7. The circuit of claim 5 wherein said switching converter generates an ac filament voltage.

8. The circuit of claim 7, further comprising means for regulating rms ac filament voltage by adjusting duty cycle of the switching converter.

9. The circuit of claim 7 wherein said switching converter comprises a single switching device.

10. The circuit of claim 1 comprising a separate current sensor associated with each respective filament.

11. The circuit of claim 1 comprising a single current sensor for sensing the instantaneous sum of currents through the filaments.

12. The circuit of claim 1 wherein the filaments are connected in series to a shunt capacitance, the shunt capacitance being connected in series with the current sensor.

13. A method for detecting filament failure in a fluorescent lamp system having at least two filaments, comprising:

sensing current through the filaments using a detection circuit comprising a dual-use transformer for coupling power to the lamp system and for providing voltage isolation for the detection circuit;

comparing the current through the filaments to a predetermined threshold; and providing a signal indicative of filament failure in anticipation of filament failure if the current through the filaments is less than the threshold, operation of the lamp being maintained during indication of filament failure by the detection circuit.

14. The method of claim 13, further comprising coupling to a filament heater supply such that each filament is coupled to the filament heater supply through a separate secondary winding.

15. The method of claim 14 wherein the filament heater supply comprises a switching converter.

16. The method of claim 15, further comprising regulating rms filament voltage by adjusting duty cycle of the switching converter.

17. The method of claim 15 wherein the switching converter generates an ac filament voltage.

18. The method of claim 17, further comprising regulating rms ac filament voltage by adjusting duty cycle of the switching converter.

19. The method of claim 13 wherein a separate current sensor senses current through each respective filament.

20. The method of claim 13 wherein a single current sensor senses the instantaneous sum of currents through the filaments.

* * * * *